(12) United States Patent
Berry

(10) Patent No.: US 6,879,146 B1
(45) Date of Patent: Apr. 12, 2005

(54) PNEUMATIC CLAMPS FOR ELECTRIC POWER LEADS

(75) Inventor: Moussa Samir Berry, Cary, NC (US)

(73) Assignee: ABB Technology AG, Zurich (CH)

( * ) Notice: Subject to any disclaimer, the term of this patent is extended or adjusted under 35 U.S.C. 154(b) by 194 days.

(21) Appl. No.: 10/322,223

(22) Filed: Dec. 18, 2002

Related U.S. Application Data

(60) Provisional application No. 60/346,374, filed on Dec. 28, 2001.

(51) Int. Cl.[7] .......................... G01R 31/02; G01R 31/06
(52) U.S. Cl. ..................................... 324/158.1; 324/726
(58) Field of Search ............................ 324/73.1, 158.1, 324/547, 726, 765; 209/572–574

(56) References Cited

U.S. PATENT DOCUMENTS

| | | | |
|---|---|---|---|
| 4,123,635 A | | 10/1978 | Rostron .................. 200/148 F |
| 4,625,189 A | | 11/1986 | Lazar et al. .................. 335/10 |
| 4,818,382 A | * | 4/1989 | Anderson et al. ........... 209/573 |
| 5,157,830 A | | 10/1992 | Koch .......................... 29/857 |
| 5,264,799 A | * | 11/1993 | Huang et al. ................ 324/726 |
| 5,568,870 A | * | 10/1996 | Utech .......................... 209/573 |
| 5,996,239 A | | 12/1999 | Ohnheiser .................... 33/503 |
| 6,100,707 A | * | 8/2000 | Baumann et al. ............ 324/761 |

OTHER PUBLICATIONS http://www.reinhardt–testsystem.de/ENRUPRO.HTM, Reinhardt System–und Messelectronic GmbH, "Starter Kit For Building Fixtures Manually," (most recent revisions May 16, 2001), pp. 1–7.

Y,K. Numa, "Automation In Instrument Transformer Testing," Zera, Metering Europe 2000 Conference and Exhibition, Munich Germany, Sep. 5–7, 2000.

www.electricdevics.com/c–t.html, Current Transformer Tester, 1 page. Nov. 2, 2000 and Apr. 15, 2001.

* cited by examiner

*Primary Examiner*—Vinh P. Nguyen
(74) *Attorney, Agent, or Firm*—Woodcock Washburn LLP

(57) ABSTRACT

This invention relates generally to an apparatus having an improved way of connecting test leads of an electrical component to be tested to leads of a test device. The apparatus has a connector housing in which the test leads are disposed and an opening into which the component leads are inserted. Also disposed within the housing is a clamp that can be moved against the component lead to mate the component lead with the test lead. A source of pressure moves the clamp to mate the leads. Preferably, the control system for moving the clamp is pneumatic. Mating the leads with a pneumatic system is efficient, and provides control over the electrical resistance that is formed between the mating leads.

20 Claims, 4 Drawing Sheets

PNEUMATIC CLAMPS FOR ELECTRIC POWER LEADS

CROSS REFERENCE TO RELATED APPLICATIONS

This application claims priority to and the benefit of the filing date of U.S. provisional patent application Ser. No. 60/346,374, filed on Dec. 28, 2001 entitled "Pneumatic Clamps for Electric Power Leads."

FIELD OF THE INVENTION

This invention relates to an apparatus and method for testing electrical components including transformers.

BACKGROUND OF THE INVENTION

This invention relates generally to an improved device for mating a lead or conductor of a device to be electrically tested to an electrical test device. Testing of electrical components such as transformers requires mating the components leads to a test device. Typically, this mating is done manually—by hand—and requires clamping the test device leads into contact with those of the test component. This has its drawbacks.

One drawback is that the manual clamping process is time consuming. Another is that the electrical contact resistance between the test device lead and the component lead is not always consistent; it becomes a function of the manual clamping process. Thus, the electrical resistance is dependent upon the operators' judgment and physical strength in clamping the components. Varied electrical resistance can lead to variation in test results. Preferably, the electrical resistance is constant so that the test results are not varied or altered by the connection resistance. In other words, it is desirable to have the electrical resistance be a constant, rather than a variable that affects test results. Another disadvantage of the manual clamping process is that the connection often has to be adjusted to accommodate different transformer sizes.

This invention relates generally to an improved device for connecting test leads to the leads of a component to be tested.

SUMMARY OF THE INVENTION

This invention includes an apparatus with an improved structure for connecting leads of an electrical test device to electrical leads of a component to be tested. The component to be tested can be any of a variety of components including, but not limited to, electrical transformers. An aspect of this invention is that the apparatus connects components leads to test leads by nonmanual means. Preferably, the means is pneumatic, but other nonmanual means may be employed.

In an embodiment of the invention, the apparatus includes an electrical test assembly that has a connection housing. The connection housing has an opening for receiving an electrical conductor of the electrical component to be tested. Also disposed within the housing is a test assembly lead that is coupled to the electrical test assembly. The test assembly lead provides the electrical interface between the electrical test assembly and the electrical component to be tested. A moveable clamp is also disposed within the housing. The moveable clamp moves within the housing so that when the electrical conductor of the electrical component to be tested is disposed within the housing opening, the clamp grabs hold of the electrical conductor and pushes the conductor into contact with the test lead.

The apparatus has a structure for moving the moving clamp. This structure includes in a preferred embodiment a source of pressurized fluid that moves the clamp to push the clamp and the electrical conductor into contact with the lead. The clamp holds the conductor against the test assembly lead with a constant pressure. This maintains a constant electrical resistance between the test assembly lead and the conductor.

The apparatus for moving the clamp includes in a preferred embodiment a pressurized tank that moves the clamp. The clamp can be connected by a rod or other structure to a piston disposed within the tank. By creating a pressure differential across the piston, the piston can be moved. Movement of the piston in a first direction moves the clamp to contact the component lead and urge the component lead into contact with the test assembly lead. Similarly, movement of the piston in a second direction moves the clamp away from the component lead when the components to be removed.

The method of testing a component preferably includes inserting the component lead into an opening in a housing. The lead components are mounted in the housing by mounting them in lugs. The clamp is then moved to contact the lead component, and the lead component is pushed into electrical contact with the test lead.

Other features of the inventions are described below.

DETAILED DESCRIPTION OF ILLUSTRATIVE EMBODIMENTS

Figure 1:
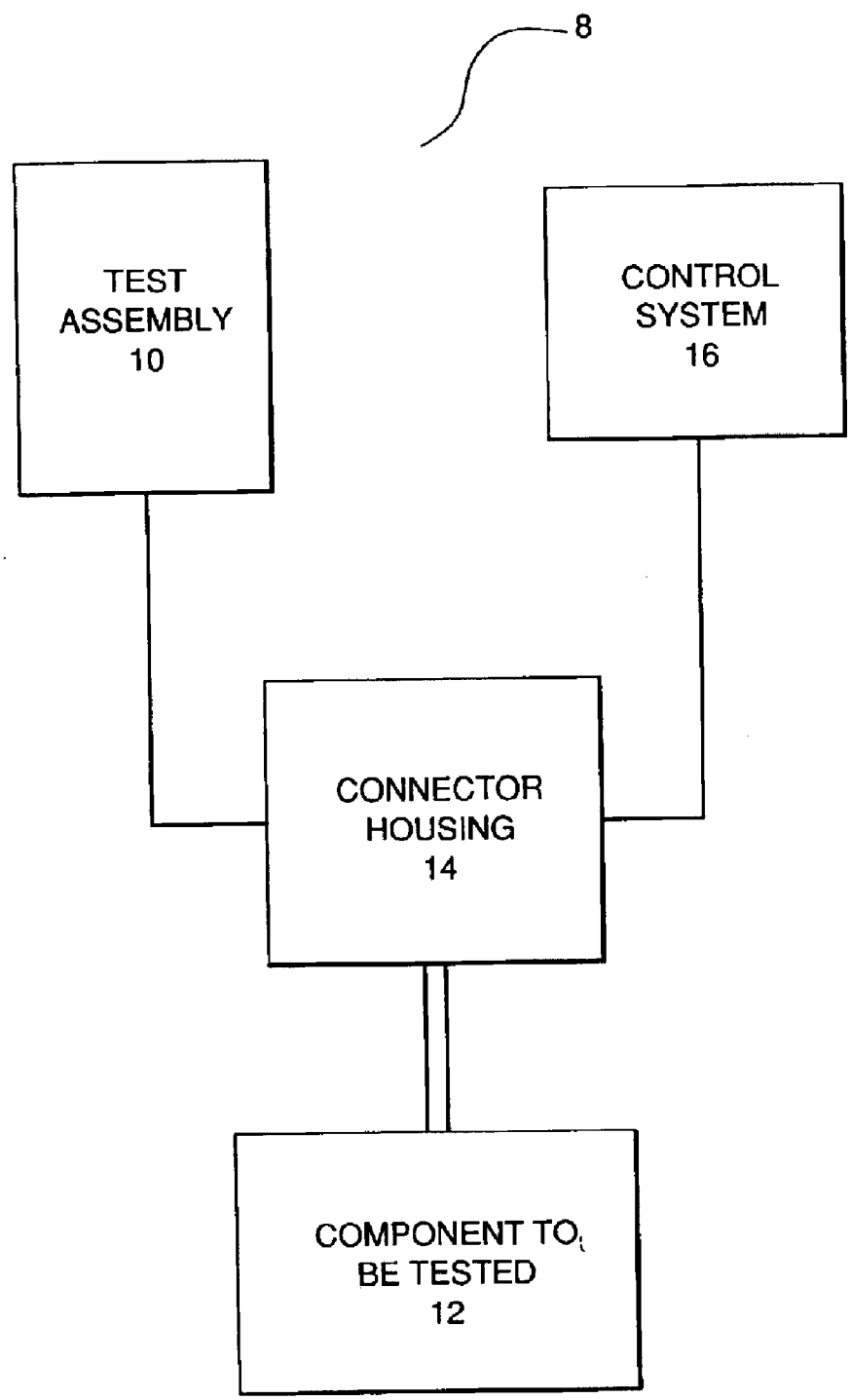
FIG. 1 is a block diagram of a system according to a preferred embodiment of this invention.

FIG. 1 schematically depicts a preferred embodiment of the system 8 this invention. In the embodiment shown, the system 8 includes a test assembly 10 for testing an electrical component 12, a connector housing 14, and a control system 16. The system 8 is in the embodiment shown for electrically connecting the tests leads of a component 12 to be electrically tested to the leads of the test assembly 10. The leads are connected in the connector housing 14, and the control system 16 controls the mating of the test component leads to the test assembly leads.

The test assembly 10 can be any of a variety of electrical test assemblies for testing any of a variety of test components 12. In a preferred embodiment, the test assembly 10 is for testing transformers, and the test components are transformers. The test assembly 10 can be of a commercial type made by Zera gmbh for instrument transformers. This example is provided by way of explanation and not by way of limitation.

Figure 2:
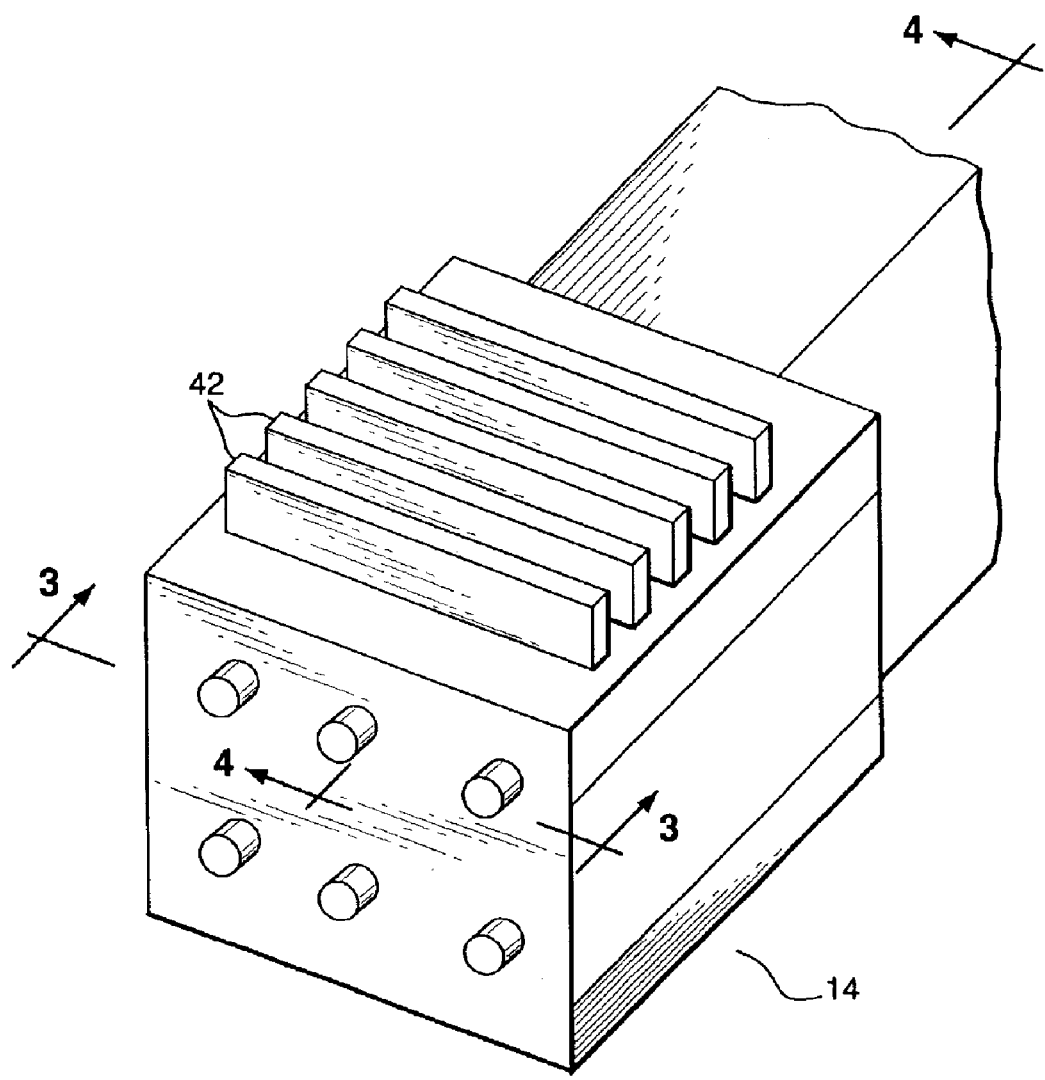
FIG. 2 is an isometric diagram of a preferred embodiment of a connector housing with an electrical component lead inserted into the housing.
Figure 3:
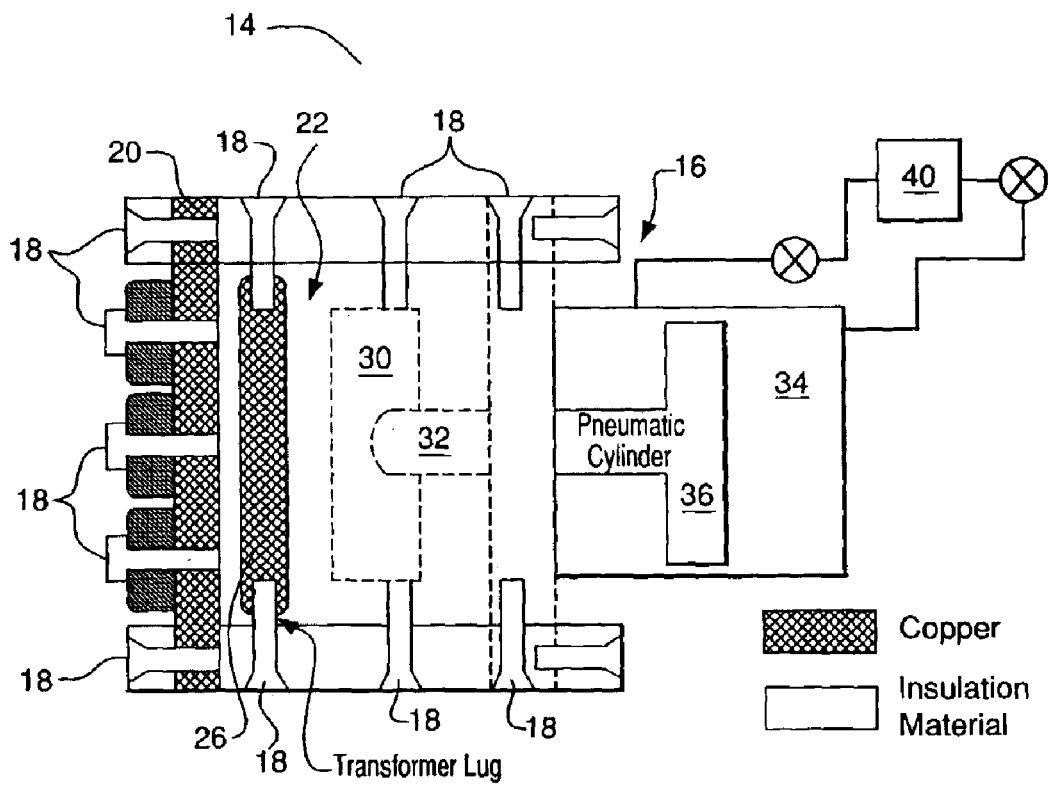
FIG. 3 is a cross-section taken along line 3—3 of FIG. 2.
Figure 4:
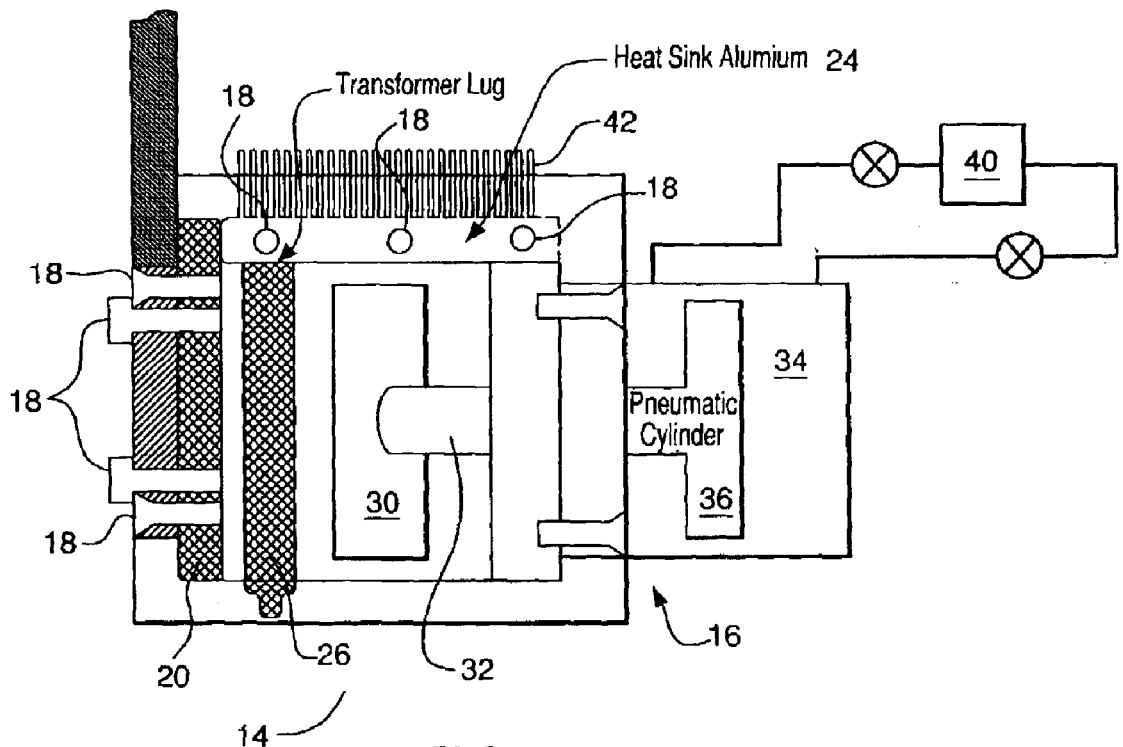
FIG. 4 is a cross-section taken along line 44 of FIG. 2.

The connector housing 14 and control system 16 are new and provide the means for mating the electrical component leads to the test assembly leads. The connector housing 14 and control system 16 can be part of the test assembly 10. FIG. 2 depicts an isometric view of a preferred embodiment of a the connector housing 14, and FIGS. 3 and 4 depict cross-sections taken through the housing 14.

The housing 14 includes in a preferred embodiment a plurality of lugs 18, a test lead 20, an opening 22 and a heat sink 24. The test lead 20 is preferably copper or any suitable electrically conductive material. The test lead 20 may be held in place by a plurality of lugs 18 or by any suitable fastening means. The test leads 20 are electrically connected to the test assembly 12.

The housing 14 is preferably open on the bottom so that a test component lead 26, which is preferably copper-but any suitable electrically conductive material can be used-can be inserted into the housing opening 22. Lugs 18 or any suitable fastening technique can be used to hold the component lead 26 in the housing. FIGS. 3 and 4 are cross-sections of the housing 14 with the component lead 26 inserted into the housing 14.

The control system 16 in the preferred embodiment shown includes a clamp 30, a rod 32, a pressurized tank 34, a piston 36. As described the control system 16 is preferably pneumatic and includes a piston and cylinder. Other embodiments such as a valving system connected to a source of pressure, such as a pressure cylinder, can of course be used. For example, in place of a piston 36 and cylinder system, a valve or pump system may be used to move the clamp. Further, the control system 16 need not be pneumatic. For instance, the control system 16 could be any suitable means for moving the clamp 30 in a controlled manner including an electrical system or an electro mechanical system. For instance, the system could have an electrical control for controlling the movement of the piston 36 by porting air through the system. The electrical system could includes a push button or the like that manipulates solenoid valves to change the pressure differential across the piston.

The clamp 30 is positioned within the connector housing so that it move laterally to mate with the component lead and push the component lead into electrical contact with the test lead. The clamp 30 may have any suitable clamping means for clamping to the component lead. Coupled to the clamp 30 by any suitable means is the rod 32. The rod 32 is connected to a piston 36 by any suitable means disposed within the source of pressure. The piston 36 can be moved laterally within the cylinder. Movement of the piston 36 causes the rod 32 and the clamp 30 to move laterally within the housing to mate the component lead with the test lead.

The source of pressurized air 36 may be a pressure cylinder or container in which the piston 36 is housed. A reservoir 40 may be connected to the source of pressurized fluid with by a series of pipes and valves so that pressure can be directed to either side of the piston 36 to move the clamp 30 either toward or away from the test lead. The fluid is preferably air but any suitable fluid can be used. The pressure of the fluid may vary with application.

The system operates as follows. The component lead is inserted into the opening in the connector housing with the clamp 30 in the position shown in FIGS. 3 and 4. The component lead is then secured to the housing lugs. Following this, the right side of the piston 36 shown in FIGS. 3 and 4 is pressurized so that the piston 36 moves to the left.

Figure 5:
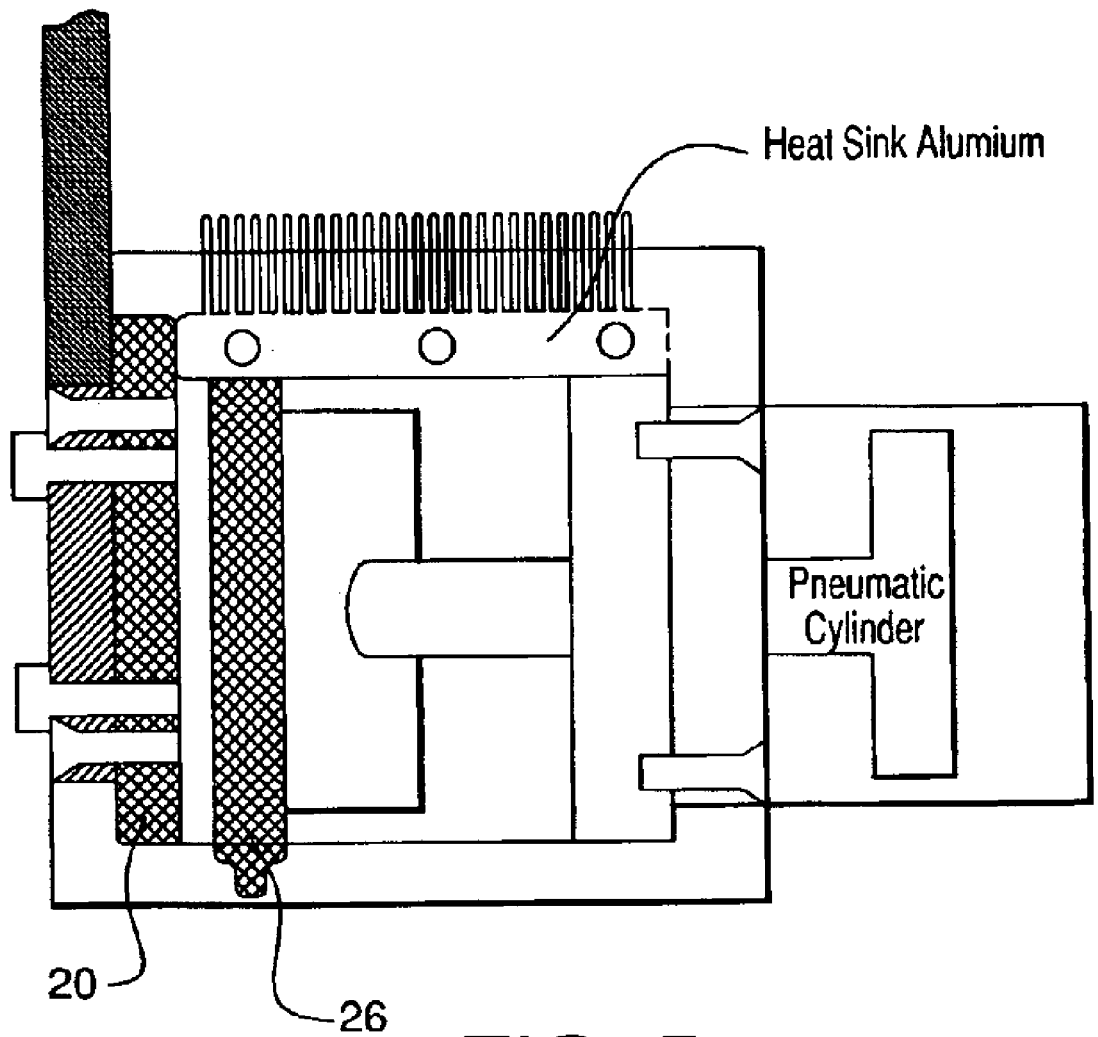
FIG. 5 is a cross-section taken along line 44 of FIG. 2 with the component lead moved to the mated position.

As the piston 36 moves to the left, the rod 32 and the clamp 30 move with the piston 36 to the left. As the clamp 30 moves to the left, the clamp 30 contacts the component lead 26, clamps onto the lead, and pushes the component lead 26 into contact with the test lead 20. Ultimately, the clamp 30 moves the component lead 26 to the position shown in FIG. 5.

The piston 36 moves to the left by the reservoir porting pressurized fluid through the piping and valve system to the right side of the piston 36. As the piston 36 moves to the left, fluid on the left side of the piston 36 is exhausted through the piping and valve system back to the reservoir 40.

The clamp 30 holds the component lead in contact with the test lead 20. This system ensures a constant pressure and the same pressure is used to mate the leads 20, 26. Because of this the electrical resistance at the mating of the contacts has much less variance and the test conditions are more effectively controlled, which leads to enhanced test results. Moreover, by mating the leads with a pneumatic system as opposed to manually the time and inefficiencies of manual mating are eliminated.

After the system has been tested, the clamp 30 is moved laterally to the right to move the component lead away from the test lead and back to the position of FIGS. 3 and 4.

It will be appreciated that this invention includes a device for mating an component lead to a test lead by other than manual means. In the preferred embodiment shown, a pneumatic system was used. Other embodiments can, however, be used including a pump that moves the clamp 30. Additionally, the control system for moving the clamp 30 could be another type of mechanical system, an electrical system, or an electro mechanical system. For instance, the control system could have an electrical controller that moves the clamp 30 in response to an electrical signal.

The housing 14 also preferably includes a heat sink 24 as alluded to above. The heat sink is preferably aluminum or any suitably thermal conducive material. The heat sink 24 may have a plurality of fins 42 extending from the heat sink in order to more effectively dissipate heat. The heat sink 24 transfers the heat generated by the leads 20, 26 in order to prevent overheating and excessive temperatures.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed:

1. An apparatus for testing an electrical device, comprising:

an electrical test assembly comprising a connection housing that has an opening for receiving an electrical conductor of the electrical device to be tested;

a lead, disposed in the connection housing, that is coupled to the electrical test assembly and that can be coupled to an electrical conductor to provide the electrical interface between the electrical test assembly and the electrical device;

a moveable clamp, disposed within the housing so that when the electrical conductor of the electrical device to be tested is disposed within the housing opening, the clamp can push the electrical conductor into contact with the lead; and a source of pressurized fluid that moves the clamp to push the clamp and the electrical conductor into contact with the lead.

2. The apparatus of claim 1, further comprising a piston disposed within the source of pressurized fluid and a rod that connects the piston to the clamp, so that the movement of the piston controls the movement of the clamp.

3. The apparatus of claim 1, further comprising lugs disposed within the housing so that the electrical conductor can be connected to the lugs when inserted into the housing opening.

4. The apparatus of claim 3, wherein the lugs are moveable.

5. The apparatus of claim 1, wherein the source of pressurized fluid is a pneumatic cylinder.

6. The device of claim 1, wherein the heat sink comprises a metal plate having fins for distributing heat.

7. The apparatus of claim 1, further comprising a heat sink disposed in the housing that distributes heat generated between the conductor and the lead when the clamp moves the conductor into contact with the lead.

8. The apparatus of claim 7, wherein the heat sink comprises aluminum.

9. The apparatus of claim 7, wherein the heat sink comprises a metal plate having fins for distributing heat.

10. An electrical test device for electrically testing an electrical component having a lead, comprising:

a test assembly;

a housing having an opening for receiving the component lead and having a test lead disposed within the housing;

a moveable clamp disposed within the housing opening; and a means for moving the clamp so that the clamp urges the component lead into contact with the test lead.

11. The device of claim 10, wherein the means for moving the clamp comprises a pneumatic means.

12. The device of claim 10, wherein the means for moving the clamp comprises a pressurized tank and a piston coupled to the clamp.

13. The device of claim 12, wherein the means further comprises a piston disposed within the source of pressurized fluid and a rod that connects the piston to the clamp, so that the movement of the piston controls the movement of the clamp.

14. The device of claim 10, further comprising lugs disposed within the housing so that the electrical component lead can be connected to the lugs when inserted into the housing opening.

15. The device of claim 14, wherein the lugs are moveable.

16. The device of claim 10, further comprising a heat sink disposed in the housing that distributes heat generated between the conductor lead and the test lead when the clamp moves the conductor into contact with the lead.

17. The device of claim 16, wherein the heat sink comprises aluminum.

18. An electrical test device for electrically testing an electrical component having a lead, comprising:

an test assembly:

a housing having an opening for receiving the component lead, a plurality of lugs into which the component lead can be received, and having a test lead disposed within the housing;

a moveable clamp disposed within the housing opening; and a pneumatic control system that moves the clamp into contact with the component lead to mate the component lead electrically with the test lead.

19. The device of claim 18, further comprising a heat sink disposed in the housing for dissipating heat generated by the component lead and the test lead.

20. The device of claim 18, wherein the pneumatic control system further comprises a piston disposed within the source of pressurized fluid and a rod that connects the piston to the clamp, so that the movement of the piston controls the movement of the clamp.

\* \* \* \* \*

UNITED STATES PATENT AND TRADEMARK OFFICE
CERTIFICATE OF CORRECTION

PATENT NO. : 6,879,146 B1
DATED : April 12, 2005
INVENTOR(S) : Moussa Samir Berry It is certified that error appears in the above-identified patent and that said Letters Patent is hereby corrected as shown below:

Column 5,
Line 5, "The device of claim 1" should read -- The device of claim 16 --.

Signed and Sealed this

Sixteenth Day of August, 2005

JON W. DUDAS
*Director of the United States Patent and Trademark Office*